(12) United States Patent
An et al.

(10) Patent No.: US 11,698,248 B1
(45) Date of Patent: Jul. 11, 2023

(54) DEVICE AND METHOD FOR MEASURING FRETTING DISPLACEMENT IN POWER CYCLE OF PRESS-PACK IGBT

(71) Applicant: Beijing University of Technology, Beijing (CN)

(72) Inventors: Tong An, Beijing (CN); Xueheng Zheng, Beijing (CN); Rui Zhou, Beijing (CN); Fei Qin, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 18/073,713

(22) Filed: Dec. 2, 2022

(30) Foreign Application Priority Data

Feb. 24, 2022 (CN) .......................... 202210175234.4

(51) Int. Cl.
| | | |
|---|---|---|
| G01B 11/02 | (2006.01) | |
| H01L 21/67 | (2006.01) | |
| G01B 11/30 | (2006.01) | |
| G01M 5/00 | (2006.01) | |
| G01M 99/00 | (2011.01) | |
| G01N 3/56 | (2006.01) | |

(52) U.S. Cl.
CPC ............ *G01B 11/02* (2013.01); *G01B 11/026* (2013.01); *G01B 11/30* (2013.01); *G01M 5/0033* (2013.01); *G01M 5/0041* (2013.01); *G01M 99/002* (2013.01); *G01N 3/56* (2013.01); *H01L 21/67259* (2013.01); *H01L 21/67288* (2013.01)

(58) Field of Classification Search
CPC ........ H01L 21/67259; H01L 21/67288; G01M 5/0033; G01M 5/0041; G01M 5/005; G01M 5/0075; G01M 5/0091; G01M 99/002; G01M 13/02; G01M 13/022; G01M 13/023; G01M 13/025; G01M 13/026; G01M 13/027; G01N 3/56; G01N 19/08; G01N 21/88; G01N 21/95; G01N 21/9501; G01B 11/02; G01B 11/026; G01B 11/16; G01B 11/24; G01B 11/245; G01B 11/26; G01B 11/30; G01B 11/303; G01B 11/306

See application file for complete search history.

(56) References Cited

FOREIGN PATENT DOCUMENTS

| | | | |
|---|---|---|---|
| CN | 102221601 | | 10/2011 |
| CN | 104392936 | | 3/2015 |
| CN | 106483928 | | 3/2017 |
| CN | 106706440 | | 5/2017 |
| CN | 107084677 | | 8/2017 |
| CN | 108183090 | | 6/2018 |
| CN | 109521347 | | 3/2019 |
| CN | 111288913 | | 6/2020 |
| CN | 112525094 | | 3/2021 |
| CN | 112597678 | | 4/2021 |
| CN | 110608963 | B * | 11/2021 |
| CN | 216695552 | U * | 6/2022 |

(Continued)

*Primary Examiner* — Gordon J Stock, Jr.
(74) *Attorney, Agent, or Firm* — Mayer & Williams PC

(57) ABSTRACT

Disclosed are a device and a method for measuring a fretting displacement in a power cycling of a press-pack insulated gate bipolar transistor (IGBT). The IGBT includes: a bracket; slide bars slidably mounted on the bracket and are arranged at least four along a circumferential direction of the bracket; sensors respectively slidably installed on the bracket and the slide bars; and a power cycling experiment device arranged inside the bracket.

9 Claims, 6 Drawing Sheets

(56) References Cited

FOREIGN PATENT DOCUMENTS

| | | |
|---|---|---|
| JP | 2010276477 | 12/2010 |
| WO | 2017107362 | 6/2017 |
| WO | WO-2021103544 A1 * | 6/2021 |
| WO | WO-2021103545 A1 * | 6/2021 |
| WO | WO-2021103546 A1 * | 6/2021 |
| WO | 2021179608 | 9/2021 |

* cited by examiner

DEVICE AND METHOD FOR MEASURING FRETTING DISPLACEMENT IN POWER CYCLE OF PRESS-PACK IGBT

CROSS-REFERENCE TO RELATED APPLICATIONS

This application claims priority to Chinese Patent Application No. 202210175234.4, filed on Feb. 24, 2022, the contents of which are hereby incorporated by reference.

TECHNICAL FIELD

The application relates to the field of fretting wear test of press-pack insulated gate bipolar transistor (IGBT) devices, and in particular to a device and a method for measuring a fretting displacement in a power cycling of a press-pack IGBT.

BACKGROUND

The so-called fretting refers to a relative movement of two connecting pieces that are in a nominal static contact, with a certain frequency and a small amplitude (usually only 10-200 μm) between two contact surfaces due to external factors such as an external vibration, a temperature change and a magnetostriction. A fretting wear is a kind of compound wear, and is caused by a relative vibration between two surfaces caused by a small amplitude. A damage caused by the fretting wear is manifested as a scratch, a metal adhesion, a pit or a pockmark (usually filled with powdery corrosion products), a local wear stripe or a groove and a surface micro-crack. The fretting wear not only changes a shape of a part, worsens a quality of a surface layer, but also reduces a dimensional accuracy and loosens tight fitting parts. The fretting wear also causes a stress concentration, the micro-crack and a fatigue fracture of the parts.

A press-pack insulated gate bipolar transistor (IGBT) device has characteristics of a high power density and a high reliability, and is an ideal high-power semiconductor switching device. Now the IGBT device has been widely used in high-end equipment industries such as light AC/DC transmission, large-scale industrial drive and energy. A power cycling experiment is an experiment to simulate a failure process of the press-pack IGBT module. The experiment accelerates a chip aging to get a failure reason of the IGBT, so the experiment greatly promotes a reliability research of the press-pack IGBT.

The fretting wear is recognized as a main failure mode of the press-pack IGBT, and mainly occurs between a molybdenum sheet and a chip, and two contact pairs are the molybdenum sheet and an aluminum metallization layer welded on the chip. During a service period of the IGBT, the temperature change may lead to a thermal expansion deformation and a relative displacement of the molybdenum sheet, while an external vibration interference may lead to a slight sliding between the molybdenum sheet and the chip and the relative displacement. The fretting wear may lead to the change of a surface roughness of the contact pairs, resulting in scratches and micro-cracks. Then the contact resistance and thermal resistance rise, and lead the junction temperature rises and becomes invalid. At present, there is little research on the fretting wear of the press-pack IGBT, and there is a lack of an experimental device for measuring a fretting displacement. Therefore, it is of great significance to design an experimental system dedicated to an in-situ measurement of the fretting displacement in a power cycling of the press-pack IGBT module.

SUMMARY

Embodiments according to the application aim to solve or improve at least one of the above technical problems.

A first aspect of the embodiment of the application is to provide a device for measuring a fretting displacement in a power cycling of a press-pack insulated gate bipolar transistor (IGBT).

A second aspect of the embodiment of the application is to provide an in-situ measurement method for a fretting displacement in a power cycling experiment of a press-pack IGBT module.

The embodiment of the first aspect of the application provides the device for measuring the fretting displacement in the power cycling of the press-pack IGBT, including a bracket; slide bars slidably mounted on the bracket and are arranged at least four along a circumferential direction of the bracket; sensors respectively slidably installed on the slide bars; and a power cycling experiment device arranged inside the bracket; the power cycling experiment device includes an IGBT chip layer, and the IGBT chip layer transversely corresponds to the sensors on the slide bars; and at least two sensors are arranged on the bracket, and longitudinally correspond to the sensors on the adjacent slide bars, and moving directions of the slide bars and the sensors are perpendicular to each other.

According to the device for measuring the fretting displacement in the power cycling of the press-pack IGBT provided by the application, the slide bars slide relative to the bracket and the sensors slide relative to the slide bars, and meanwhile a moving direction between the sensors and the slide bars has a vertical characteristic, so the sensors may move at any position in a longitudinal vertical plane. The sensors adopt picometer laser displacement sensors. The application is specially used for an in-situ measurement of the fretting displacement in a power cycling experiment of a press-pack IGBT module. A non-contact in-situ measurement is adopted, and has no influence on the power cycling experiment in a measurement process, and electric heating changes in the power cycling experiment do not damage measuring equipment. Moreover, the non-contact in-situ measurement does not change structural characteristics, so the measurement has a high measurement accuracy and a fast dynamic response.

In the application, two zero position sensors on the bracket are designed to measure a real-time displacement zero position in the experiment, so an influence of a large displacement caused by problems such as a water tank vibration in the experiment is avoided.

According to the application, four displacement sensors on the slide bars are designed to observe an in-situ fretting displacement through a correlation, and numerical values and angles of a micro-sliding deformation and a thermal expansion deformation may be effectively distinguished by a fretting displacement calculation method.

In addition, the technical scheme provided according to the embodiment of the application may also have the following additional technical features:

In any of the above technical schemes, the bracket includes: a bottom frame, and the power cycling experiment device is arranged in a middle of the bottom frame, and the sensors are slidably mounted on an upper surface of the bottom frame; and supporting rods, installed on the bottom frame, and at least four supporting rods are arranged along the circumferential direction of the bottom frame, and are respectively connected with the adjacent slide bars in a sliding way.

In this technical scheme, the temporarily placed power cycling experiment device may be directly placed in the middle by a setting of the bottom frame, and the sensors and the slide bars are arranged in a way of surrounding the power cycling experiment device by adding the supporting rods. On the one hand, a rapid placement and a rapid pickup of the power cycling experiment device are facilitated; on the other hand, a comprehensive circumferential monitoring of the IGBT chip layer of the power cycling experiment device may be conducted.

In any of the above technical schemes, the device for measuring the fretting displacement in the power cycling of the press-pack IGBT further includes chutes, and the chutes are respectively formed on upper surfaces of the slide bars, side walls of the supporting rods and the upper surface of the bottom frame; and guide parts, arranged inside the chutes, and the guide parts are respectively arranged on end walls of the slide bars and lower surfaces of the sensors.

In the technical scheme, the slide bars on the supporting rods and the sensors on the slide bars and the bottom frame may be adjusted quickly by a cooperative arrangement of the chutes and the guide parts. At the same time, a quick docking and setting of the IGBT chip layer in the placed power cycling experiment may be realized.

In any of the above technical schemes, the guide parts include sliders; the side walls of the sliders are attached to inner walls of the chutes, and the side walls of the sliders are fixedly connected with the end walls of the slide bars and the sensors.

In the technical scheme, each slider slides in close contact with each chute, and each slider is set in a convex shape, so that when each slider slides with each chute, a transmission rod installed on each slider is not damaged, and each sensor may be more conveniently exposed to an outside of each chute, so as to directly monitor the IGBT chip layer.

In any of the above technical solutions, each guide part further includes a motor installed on each slider for driving each slider and each sensor to move along each chute; and an electromagnetic switch, installed on each slider; and each electromagnetic switch is used for matching with the inner walls of each chute to fix each slider in each chute.

In the technical scheme, each motor and a driving wheel installed at an output end of each motor roll with the upper surface of each slide bar and the upper surface of the bottom frame, so that each slider may automatically drive each sensor to move. A movable iron core extended by each electromagnetic switch abuts against the inside of each chute to limit a movement of each slider, ensuring that each sensor does not move at will during an experiment and reducing a measurement deviation. Each electromagnetic switch and each motor are programmed and controlled by a PLC controller.

In any of the above technical schemes, a bolt is inserted into a joint between each slider and each sensor.

In the technical scheme, each bolt ensures that each sensor does not deviate from each slider during the movement of each slider, and each inserted bolt may also ensure a stable posture of each sensor on each slider.

In any of the above technical schemes, the power cycling experiment device further includes a water-cooling heat dissipation assembly, and the water-cooling heat dissipation assembly clamps and fixes the IGBT chip layer; a power cycling experiment bracket, and the power cycling experiment bracket is arranged in the middle of the bottom frame, and the water-cooling heat dissipation assembly is fixed inside the power cycling experiment bracket.

In this technical scheme, the water-cooling heat dissipation assembly ensures a heat dissipation of the IGBT chip layer during the experiment, and the IGBT chip layer is protected and moved by the power cycling experiment bracket, so that the IGBT chip layer may work normally in repeated experiments for experimental measurements.

The second aspect of the embodiment of the application is to provide an in-situ measurement method for a fretting displacement in a power cycling experiment of a press-pack IGBT module, including following steps: S1, controlling the sensors to positions of the chip layer where the fretting displacements need to be measured by the motors, and fixing the picometer laser displacement sensors by the electromagnetic switches; S2, since reflected lights of the sensors change when the chip layer frets, transmitting the electrical signals to a computer through an acquisition card after a photoelectric conversion; and S3, calculating a thermal expansion rate, a micro-sliding amount and a micro-sliding angle through the electrical signals received by the six sensors; and the in-situ measurement method for the fretting displacement in the power cycling experiment of the press-pack IGBT module is used for the measurement by the device for measuring the fretting displacement in the power cycling of the press-pack IGBT in any embodiment of the first aspect.

According to the embodiment of the application, the device for measuring the fretting displacement in the power cycling of the press-pack IGBT provided by any of the embodiments of the first aspect has all beneficial effects of any of the above-mentioned embodiments, so is not repeated here.

In any of the above embodiments, the micro-sliding amount is calculated according to following formulas through the electric signals received by the six sensors:

$$S_1 = \frac{a_1 l}{2} + X_t + X_0$$

$$S_2 = \frac{a_2 l}{2} + Y_t + Y_0$$

$$S_3 = \frac{a_1 l}{2} - X_t - X_0$$

$$S_4 = \frac{a_2 l}{2} - Y_t - Y_0$$

$$S_5 = X_0$$

$$S_6 = Y_0,$$

where $a_1$ is the thermal expansion rate of the chip in the X direction, $a_2$ is the thermal expansion rate of the chip in the Y direction, $l$ is an initial side length of the chip, $X_0$ is the zero position of the chip in the X direction, $Y_0$ is the zero position of the chip in the Y direction, $X_t$ is a micro-sliding displacement of the chip in the X direction, $Y_t$ is the micro-sliding displacement of the chip in the Y direction, and $S_1$-$S_6$ are displacement changes measured by the six sensors respectively.

In this embodiment, through the sensors on the four slide bars and the two sensors on the bottom frame, the distance between the sensors and a measured object is 20-50 mm, and measurement results of the sensors are converted into the electrical signals and transmitted to the acquisition card, and a conversion voltage is 0-5 V. With the help of initial parameters and measured values, the micro-sliding amount is calculated.

In any of the above embodiments, the thermal expansion rate and the micro-sliding angle are calculated through the electric signals received by the six sensors and according to the following formulas:

$$a_1 = \frac{S_1 + S_3}{l}$$

$$a_2 = \frac{S_2 + S_4}{l}$$

$$X_t = \frac{S_1 - S_3}{2} - X_0$$

$$Y_t = \frac{S_2 - S_4}{2} - Y_0$$

$$\theta = \arctan\frac{X_t}{Y_t} = \arctan\frac{S_1 - S_3 - 2X_0}{S_2 - S_4 - 2Y_0},$$

where θ is the micro-sliding angle.

In this embodiment, the final thermal expansion rate and the final micro-sliding angle may be obtained by the above formulas and various measured parameters.

Additional aspects and advantages of embodiments according to the application become apparent in the following description, or may be learned by a practice of the embodiments according to the application.

DETAILED DESCRIPTION OF THE EMBODIMENTS

In order to understand above objects, features and advantages of the application more clearly, the application is described in further detail below with reference to drawings and detailed description. It should be noted that embodiments of the present application and the features in the embodiments may be combined with each other without conflict.

In the following description, many specific details are set forth in order to fully understand the application. However, the application may be implemented in other ways different from those described here. Therefore, a scope of protection of the application is not limited by the specific embodiments disclosed below.

Figure 1:
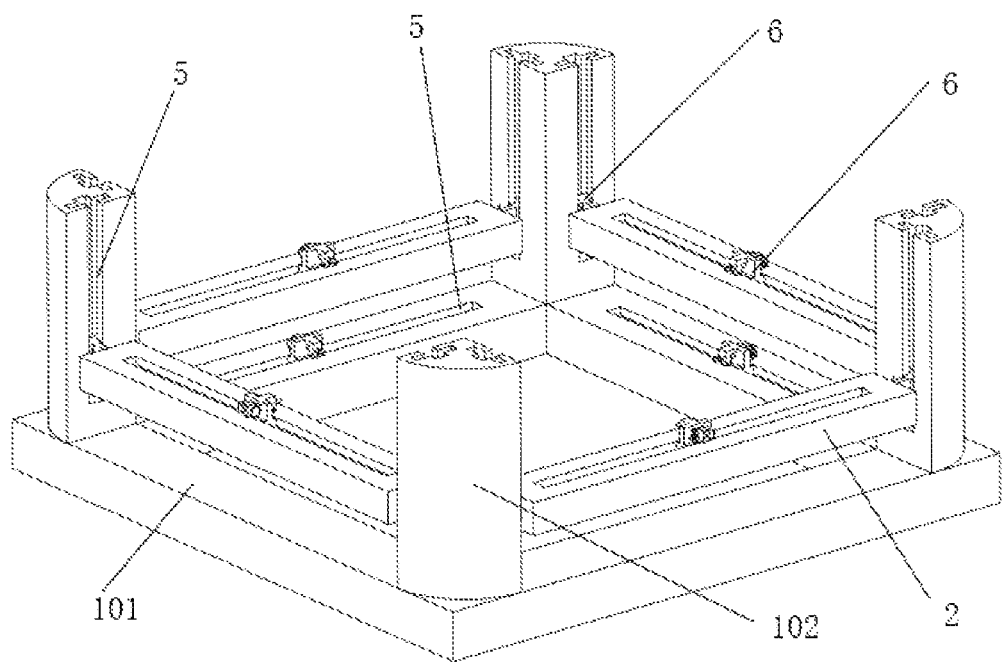
FIG. 1 is a schematic diagram of an overall structure according to the application.
Figure 2:
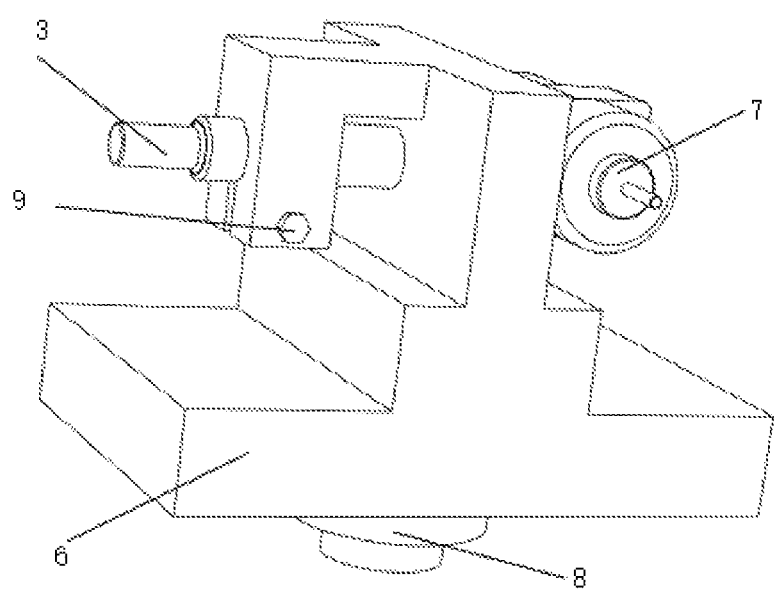
FIG. 2 is a schematic diagram of a slider structure according to the application.
Figure 3:
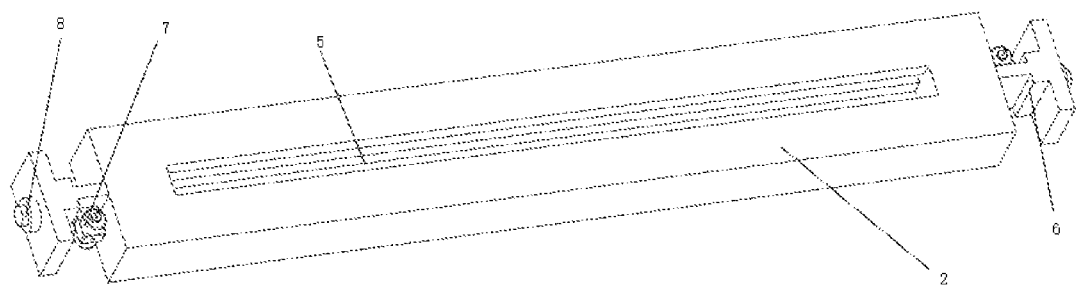
FIG. 3 is a schematic diagram of a slide bar structure according to the application.
Figure 4:
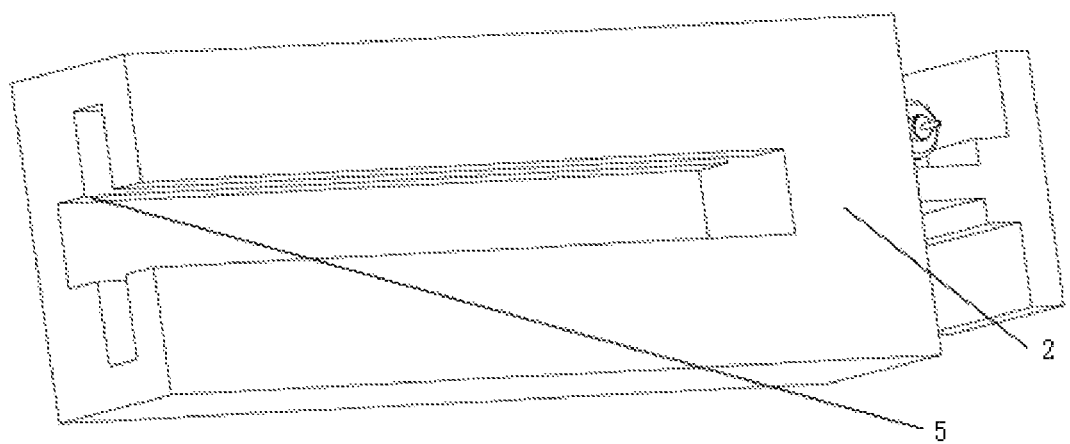
FIG. 4 is a schematic structural diagram of a slide bar after a partial section according to the application.
Figure 5:
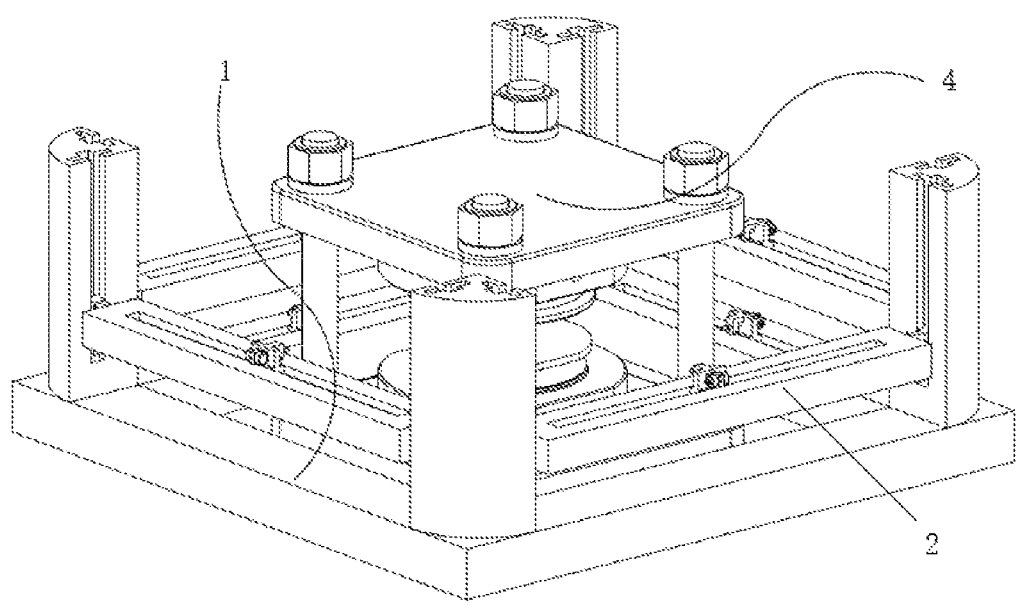
FIG. 5 is a schematic diagram of a power cycling experiment device and an insulated gate bipolar transistor (IGBT) chip structure according to the application.
Figure 6:
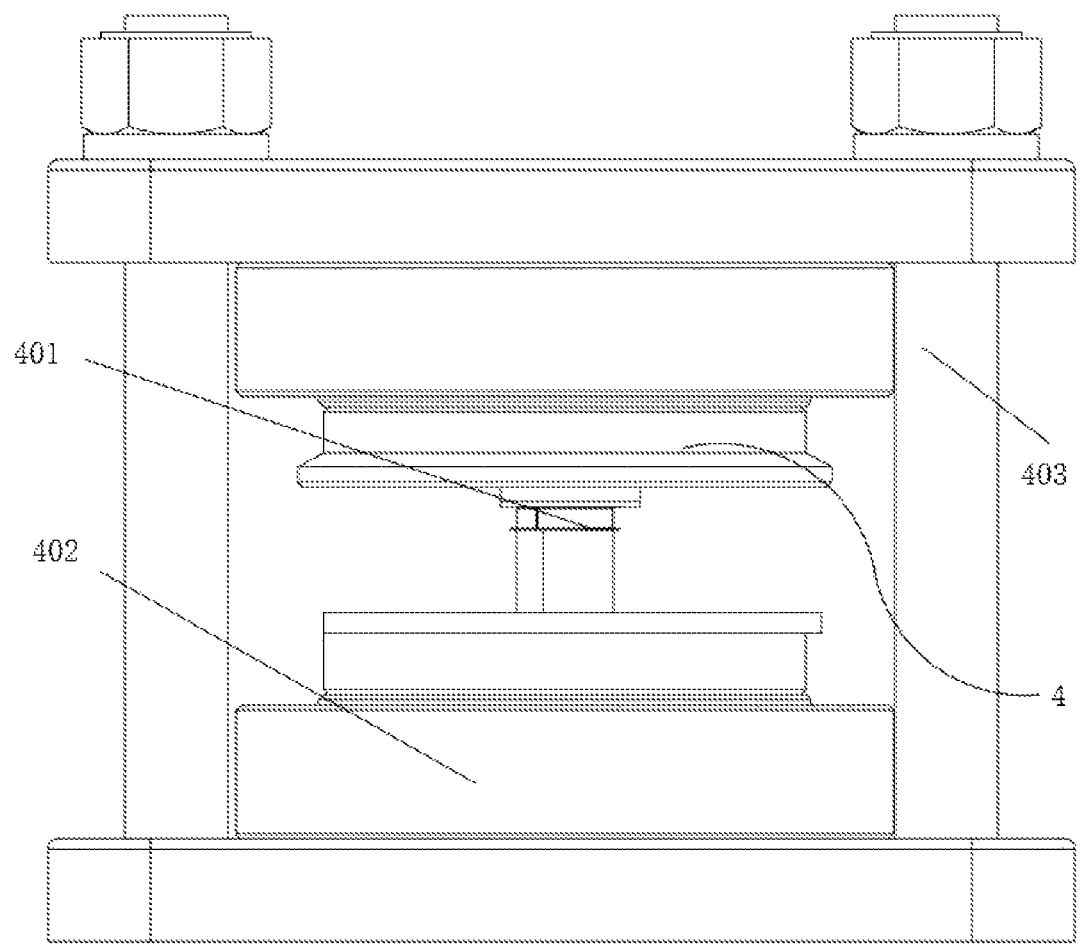
FIG. 6 is a front view of a power cycling experiment device and an insulated gate bipolar transistor (IGBT) chip according to the application.

With reference to FIGS. 1-6, an embodiment of a first aspect of the application provides a device for measuring a fretting displacement in a power cycling of a press-pack insulated gate bipolar transistor (IGBT), including a bracket 1; slide bars 2 slidably mounted on the bracket 1 and are arranged at least four along a circumferential direction of the bracket 1; sensors 3, respectively slidably installed on the bracket 1 and the slide bars 2; and a power cycling experiment device 4, arranged inside the bracket 1. The power cycling experiment device 4 includes an IGBT chip layer 401, and the IGBT chip layer 401 transversely corresponds to the sensors 3 on the slide bars 2; and at least two sensors 3 are arranged on the bracket 1, and longitudinally correspond to the sensors 3 on the adjacent slide bars 2, and moving directions of the slide bars 2 and the sensors 3 are perpendicular to each other.

According to the device for measuring the fretting displacement in the power cycling of the press-pack IGBT provided by the application, the slide bars 2 slide relative to the bracket 1 and the sensors 3 slide relative to the slide bars 2, and meanwhile a moving direction between the sensors 3 and the slide bars 2 has a vertical characteristic, so the sensors 3 may move at any position in a longitudinal vertical plane. The sensors 3 adopt picometer laser displacement sensors 3. The application is specially used for an in-situ measurement of the fretting displacement in a power cycling experiment of a press-pack IGBT module. A non-contact in-situ measurement is adopted, and has no influence on the power cycling experiment in a measurement process, and electric heating changes in the power cycling experiment do not damage measuring equipment. Moreover, the non-contact in-situ measurement does not change structural characteristics, so the measurement has a higher measurement accuracy and a faster dynamic response.

In the application, two zero position sensors 3 on the bracket 1 are designed to measure a real-time displacement zero position in the experiment, so an influence of a large displacement caused by problems such as a water tank vibration in the experiment is avoided.

According to the application, four displacement sensors 3 on the slide bars 2 are designed to observe an in-situ fretting displacement through a correlation, and numerical values and angles of a micro-sliding deformation and a thermal expansion deformation may be effectively distinguished by a fretting displacement calculation method.

Specifically, the bracket 1 and the slide bars 2 are made of cast iron, the sensors 3 are the picometer laser displacement sensors 3. A triaxial picometer precision laser interference displacement sensor 3IDS3010 made by Attocube System AG, Germany, may accurately measure the displacements and a vibration, with a resolution as high as 0.25 pm, a response frequency of 0-500 kHz and a measuring range of 20-50 mm. Each sensor 3 is still equipped with an acquisition card which adopts a PCI-1800H multifunctional acquisition card. Therefore a continuous and smooth data acquisition at 330 kHz in a Windows system is realized.

In any of the above embodiments, as shown in FIGS. 1-6, the bracket 1 includes a bottom frame 101; the power cycling experiment device 4 is arranged in a middle of the bottom frame 101, and the sensors 3 are slidably mounted on an upper surface of the bottom frame 101; and supporting rods 102, installed on the bottom frame 101, and at least four supporting rods 102 are arranged along the circumferential direction of the bottom frame 101, and are respectively connected with the adjacent slide bars 2 in a sliding way.

In this embodiment, the temporarily placed power cycling experiment device 4 may be directly placed in the middle by a setting of the bottom frame 101, and the sensors 3 and the slide bars 2 are arranged in a way of surrounding the power cycling experiment device 4 by adding the supporting rods 102. On the one hand, a rapid placement and a rapid pickup of the power cycling experiment device 4 are facilitated; on the other hand, a comprehensive circumferential monitoring of the IGBT chip layer 401 of the power cycling experiment device 4 may be conducted.

Specifically, the bottom frame 101 is a rectangular frame with an overall size of 200 mm×200 mm×15 mm and a hollow part of 150 mm×150 mm×15 mm. In order to place two picometer laser displacement sensors 3 on the bottom frame 101 in an X direction and a Y direction, the supporting rods 102 are vertically installed at the four corners of the bottom frame 101 with a height of 70 mm. The four supporting rods 102 are completely the same, and are centrally symmetrical inward.

In any of the above embodiments, as shown in FIGS. 1-6, the device for measuring the fretting displacement in the power cycling of the press-pack IGBT further includes chutes 5; the chutes 5 are respectively formed on the upper surfaces of the slide bars 2, side walls of the supporting rods 102 and the upper surface of the bottom frame 101; guide parts are arranged inside the chutes 5, and the guide parts are respectively arranged on end walls of the slide bars 2 and lower surfaces of the sensors 3.

In this embodiment, the slide bars 2 on the supporting rods 102 and the sensors 3 on the slide bars 2 and the bottom frame 101 may be adjusted quickly by a cooperative arrangement of the chutes 5 and the guide parts, so a quick docking and the setting of the IGBT chip layer 401 of the placed power cycling experiment device 4 are facilitated, an operation is easy and the setting is simple.

In any of the above embodiments, as shown in FIGS. 1-6, the guide parts include sliders 6; the side walls of the sliders 6 are attached to inner walls of the chutes 5, and the side walls of the sliders 6 are fixedly connected with the end walls of the slide bars 2 and the sensors 3.

In this embodiment, each slider 6 slides in close contact with each chute 5, and each slider 6 is set in a convex shape, so that when each slider 6 slides with each chute 5, a transmission rod installed on each slider 6 is not damaged, and each sensor 3 may be more conveniently exposed to an outside of each chute 5, so as to directly monitor the IGBT chip layer 401.

Specifically, there is a chute 5 on the bottom frame 101 in the X direction and the Y direction respectively. Each chute 5 is 120 mm long, with an internal axisymmetric shape, a full width of 15 mm and a height of 7.5 mm, and the size is the same as the slider 6, so that the two may be assembled. The supporting rods 102 are vertically installed at the four corners of the base, with a height of 70 mm. The supporting rods 102 are identical and are symmetrical inward. Each supporting rod 102 is provided with a chute 5 with the same size as a big base. Each chute 5 in each slide bar 2 is the same size as each chute 5 in the bottom frame 101. Compared with each horizontal slider 6, a fixed end of each sensor 3 is reduced by each vertical slider 6 on each slide bar 2.

In an embodiment, there are six picometer laser displacement sensors 3, four of which, a first picometer laser displacement sensor 3, a second picometer laser displacement sensor 3, a third picometer laser displacement sensor 3 and a fourth picometer laser displacement sensor 3, are used to measure the fretting displacements in the X and Y directions. The first and third picometer laser displacement sensors 3 are installed on the sliders 6 in the X direction, and the second and fourth picometer laser displacement sensors 3 are installed on the sliders 6 in the Y direction. The remaining two picometer laser displacement sensors 3 are used to measure the displacement zero positions in the X and Y directions; and the remaining two picometer laser displacement sensors 3 are a fifth picometer laser displacement sensor 3 and a sixth picometer laser displacement sensor 3 respectively installed on the sliders 6 on the chutes 5 of the bottom frame 101.

The first and third picometer laser displacement sensors 3 have the same coordinates in the Y direction and a Z direction, the second and fourth picometer laser displacement sensors 3 have the same coordinates in the X direction and the Z direction, the first and fifth picometer laser displacement sensors 3 have the same coordinates in the Y direction, and the second and sixth picometer laser displacement sensors 3 have the same coordinates in the X direction.

In any of the above embodiments, as shown in FIGS. 1-6, each guide part further includes a motor 7 installed on each slider 6 for driving each slider 6 and each sensor 3 to move along each chute 5; and an electromagnetic switch 8, installed on each slider 6; and each electromagnetic switch 8 is used for matching with the inner walls of each chute 5 to fix each slider 6 in each chute 5.

In this embodiment, each motor 7 and a driving wheel installed at an output end of each motor 7 roll with the upper surface of each slide bar 2 and the upper surface of the bottom frame 101, so that each slider 6 may automatically drive each sensor 3 to move. A movable iron core extended by each electromagnetic switch 8 abuts against the inside of each chute 5 to limit a movement of each slider 6, ensuring that each sensor 3 does not move at will during an experiment and reducing a measurement deviation. Each electromagnetic switch 8 and each motor 7 are programmed and controlled by a PLC controller.

Specifically, each motor 7 is a German Bell 12 V micro DC motor 7 with a length of 10 mm, a diameter of 8 mm, a torque of 2 Nm, a temperature resistance and a low noise. Each electromagnetic switch 8 is an IDEC electromagnetic switch 8.

In any of the above embodiments, as shown in FIGS. 1-6, a bolt 9 is inserted into a joint between each slider 6 and each sensor 3.

In this embodiment, each bolt 9 ensures that each sensor 3 does not deviate from each slider 6 during the movement of each slider 6, resulting in an inaccurate measurement position of each sensor 3 after a position adjustment, and inserting each bolt 9 ensures a stable posture of each sensor 3 on each slider 6.

In any of the above embodiments, as shown in FIGS. 1-6, the power cycling experiment device 4 further includes a water-cooling heat dissipation assembly 402, and the water-cooling heat dissipation assembly 402 clamps and fixes the IGBT chip layer 401; a power cycling experiment bracket 403, and the power cycling experiment bracket 403 is arranged in the middle of the bottom frame 101, and the water-cooling heat dissipation assembly 402 is fixed inside the power cycling experiment bracket 403.

In this embodiment, the water-cooling heat dissipation assembly 402 ensures a heat dissipation of the IGBT chip layer 401 during the experiment, and the IGBT chip layer 401 is protected and moved by the power cycling experiment bracket 403, so that the IGBT chip layer 401 may work normally in repeated experiments for experimental measurements.

With Reference to FIGS. 1-6, a second aspect of the embodiment of the application is to provide an in-situ measurement method for a fretting displacement in a power cycling experiment of a press-pack IGBT module, including following steps: S1, controlling the sensors 3 to positions of the chip layer where the fretting displacements need to be measured by the motors 7, and fixing the picometer laser displacement sensors 3 by the electromagnetic switches 8; S2, since reflected lights of the sensors 3 change when the chip layer frets, transmitting the electrical signals to a computer through an acquisition card after a photoelectric conversion; and S3, calculating the thermal expansion rate, a micro-sliding amount and a micro-sliding angle through the electrical signals received by the six sensors 3; and the in-situ measurement method for the fretting displacement in the power cycling experiment of the press-pack IGBT module is used for the measurement by the device for measuring the fretting displacement in the power cycling of the press-pack IGBT in any embodiment of the first aspect.

According to the embodiment of the application, the device for measuring the fretting displacement in the power cycling of the press-pack IGBT provided by any of the embodiments of the first aspect has all beneficial effects of any of the above-mentioned embodiments, so is not repeated here.

In any of the above embodiments, the micro-sliding amount is calculated according to following formulas through the electric signals received by the six sensors 3:

$$S_1 = \frac{a_1 l}{2} + X_t + X_0$$

$$S_2 = \frac{a_2 l}{2} + Y_t + Y_0$$

$$S_3 = \frac{a_1 l}{2} - X_t - X_0$$

$$S_4 = \frac{a_2 l}{2} - Y_t - Y_0$$

$$S_5 = X_0$$

$$S_6 = Y_0,$$

where at is the thermal expansion rate of the chip in the X direction, $a_2$ is the thermal expansion rate of the chip in the Y direction, l is an initial side length of the chip, $X_0$ is the zero position of the chip in the X direction, $Y_0$ is the zero position of the chip in the Y direction, $X_t$ is a micro-sliding displacement of the chip in the X direction, $Y_t$ is the micro-sliding displacement of the chip in the Y direction, and $S_1$-$S_6$ are displacement changes measured by the six sensors respectively.

In this embodiment, through the sensors 3 on the four slide bars 2 and the two sensors 3 on the bottom frame 101, the distance between the sensors 3 and a measured object is 20-50 mm, and measurement results of the sensors 3 are converted into the electrical signals and transmitted to the acquisition card, and a conversion voltage is 0-5 V. With the help of initial parameters and measured values, the micro-sliding amount is calculated.

In any of the above embodiments, the thermal expansion rate and the micro-sliding angle are calculated through the electric signals received by the six sensors 3 and according to the following formulas:

$$a_1 = \frac{S_1 + S_3}{l}$$

$$a_2 = \frac{S_2 + S_4}{l}$$

$$X_t = \frac{S_1 - S_3}{2} - X_0$$

$$Y_t = \frac{S_2 - S_4}{2} - Y_0$$

$$\theta = \arctan\frac{X_t}{Y_t} = \arctan\frac{S_1 - S_3 - 2X_0}{S_2 - S_4 - 2Y_0},$$

where θ is the micro-sliding angle.

In this embodiment, the final thermal expansion rate and the final micro-sliding angle may be obtained by the above formulas and various measured parameters.

Working principle:

Before the start of the power cycling experiment, a target measurement position is selected, and the motors 7 drive and control the slide bars 2 and the sliders 6 to move, so that the six picometer laser displacement sensors 3 reach predetermined positions. After the experiment begins, when the IGBT chip layer 401 at the target position generates the fretting displacement, laser signals emitted by the sensors 3 change, and the sensors 3 convert optical signals into the electrical signals and import them into the acquisition card; and the acquisition card stores the data and imports the data into the computer for a data processing to get final results.

In a description of the application, it should be understood that terms "vertical", "horizontal", "top", "bottom", "front", "back", "left", "right", "vertical", "horizontal", "top", "bottom", "inside", "outside" and other directions or positional relationships indicated are based on the directions or positional relationships shown in the drawings, only for a convenience of describing the application, rather than indicating or implying that the device or an element referred to must have a specific orientation, be constructed and operate in a specific orientation. Therefore, it may not be understood as a limitation of the application.

The above-mentioned embodiments only describe a preferred mode of the application, but do not limit a scope of the application. On a premise of not departing from a design spirit of the application, all kinds of modifications and improvements made by ordinary technicians in the field to the technical scheme of the application shall fall within the scope of protection determined by the claims of the application.

What is claimed is:

1. An in-situ measurement method for a fretting displacement in a power cycling experiment of a press-pack insulated gate bipolar transistor (IGBT) module,
   wherein the in-situ measurement method for the fretting displacement in the power cycling experiment of the press-pack IGBT module is measured by a device for measuring a fretting displacement in a power cycling of a press-pack IGBT,
   the device for measuring the fretting displacement in the power cycling of the press-pack IGBT comprises:
   a bracket;
   slide bars slidably mounted on the bracket and at least four slide bars are arranged along a circumferential direction of the bracket;
   sensors respectively slidably installed on the bracket and the slide bars;
   and a power cycling experiment device arranged inside the bracket; the power cycling experiment device comprises an IGBT chip layer, wherein the IGBT chip layer transversely corresponds to the sensors on the slide bars;

at least two sensors are arranged on the bracket, and longitudinally correspond to the sensors on adjacent slide bars, and moving directions of the slide bars and the sensors are perpendicular to each other;

the sensors adopt picometer laser displacement sensors; there are six picometer laser displacement sensors, wherein four, a first picometer laser displacement sensor, a second picometer laser displacement sensor, a third picometer laser displacement sensor and a fourth picometer laser displacement sensor, are used to measure the fretting displacements in an X direction and a Y direction; the first and third picometer laser displacement sensors are installed on sliders in the X direction, and the second and fourth picometer laser displacement sensors are installed on the sliders in the Y direction; the remaining two picometer laser displacement sensors are used to measure displacement zero positions in the X and Y directions, and are a fifth picometer laser displacement sensor and a sixth picometer laser displacement sensor respectively, and are installed on the sliders on chutes of a bottom frame; the first and third picometer laser displacement sensors have the same coordinates in the Y direction and a Z direction, the second and fourth picometer laser displacement sensors have the same coordinates in the X direction and the Z direction, the first and fifth picometer laser displacement sensors have the same coordinates in the Y direction, and the second and sixth picometer laser displacement sensors have the same coordinates in the X direction; and the in-situ measurement method for the fretting displacement in the power cycling experiment of the press-pack IGBT module comprises:

S1, controlling the sensors to positions of the chip layer where the fretting displacements need to be measured by motors, and fixing the picometer laser displacement sensors by electromagnetic switches;

S2, since reflected lights of the sensors change when the chip layer frets, transmitting electrical signals to a computer through an acquisition card after a photoelectric conversion; and S3, calculating a thermal expansion rate, a micro-sliding amount and a micro-sliding angle through the electrical signals received by the six sensors.

2. The in-situ measurement method for the fretting displacement in the power cycling experiment of the press-pack IGBT module according to claim 1, wherein the bracket comprises:

the bottom frame, wherein the power cycling experiment device is arranged in a middle of the bottom frame, and the sensors are slidably mounted on an upper surface of the bottom frame; and supporting rods, installed on the bottom frame, and at least four supporting rods are arranged along the circumferential direction of the bottom frame, and are respectively connected with the adjacent slide bars in a sliding way.

3. The in-situ measurement method for the fretting displacement in the power cycling experiment of the press-pack IGBT module according to claim 2, wherein in the device for measuring the fretting displacement further comprises :

chutes, wherein the chutes are respectively formed on upper surfaces of the slide bars, side walls of the supporting rods and the upper surface of the bottom frame; and guide parts, arranged inside the chutes, wherein the guide parts are respectively arranged on end walls of the slide bars and lower surfaces of the sensors.

4. The in-situ measurement method for the fretting displacement in the power cycling experiment of the press-pack IGBT module according to claim 3, wherein the guide parts comprise:

sliders, wherein side walls of the sliders are attached to inner walls of the chutes, and the side walls of the sliders are fixedly connected with the end walls of the slide bars and the sensors.

5. The in-situ measurement method for the fretting displacement in the power cycling experiment of the press-pack IGBT module according to claim 4, wherein the guide parts further comprise:

motors installed on the sliders for driving the sliders and sensors to move along the chutes; and electromagnetic switches installed on the sliders and are used for matching with the inner walls of the chutes to fix the sliders in the chutes.

6. The in-situ measurement method for the fretting displacement in the power cycling experiment of the press-pack IGBT module according to claim 4, wherein a bolt is inserted into a joint between each slider and each sensor.

7. The in-situ measurement method for the fretting displacement in the power cycling experiment of the press-pack IGBT module according to claim 2, wherein the power cycling experiment device further comprises:

a water-cooling heat dissipation assembly, wherein the water-cooling heat dissipation assembly clamps and fixes an IGBT chip layer; and a power cycling experiment bracket, wherein the power cycling experiment bracket is arranged in a middle of the bottom frame, and the water-cooling heat dissipation assembly is fixed inside the power cycling experiment bracket.

8. The in-situ measurement method for the fretting displacement in the power cycling experiment of the press-pack IGBT module according to claim 1, wherein a micro-sliding amount is calculated according to following formulas through electric signals received by the six sensors:

$$S_1 = \frac{a_1 l}{2} + X_t + X_0$$

$$S_2 = \frac{a_2 l}{2} + Y_t + Y_0$$

$$S_3 = \frac{a_1 l}{2} - X_t - X_0$$

$$S_4 = \frac{a_2 l}{2} - Y_t - Y_0$$

$$S_5 = X_0$$

$$S_6 = Y_0$$

wherein $a_1$ is a thermal expansion rate of the chip layer in the X direction, $a_2$ is the thermal expansion rate of the chip layer in the Y direction, l is an initial side length of the chip layer, $X_0$ is a zero position of the chip layer in the X direction, $Y_0$ is the zero position of the chip layer in the Y direction, $X_t$ is a micro-sliding displacement of the chip layer in the X direction, $Y_t$ is the micro-sliding displacement of the chip layer in the Y direction, and $S_1$-$S_6$ are displacement changes measured by the six sensors respectively.

9. The in-situ measurement method for the fretting displacement in the power cycling experiment of the press-pack IGBT module according to claim 8, wherein the thermal expansion rate and a micro-sliding angle are calculated through the electric signals received by the six sensors and according to the following formulas:

$$a_1 = \frac{S_1 + S_3}{1}$$

$$a_2 = \frac{S_2 + S_4}{1}$$

$$X_t = \frac{S_1 - S_3}{2} - X_0$$

$$Y_t = \frac{S_2 - S_4}{2} - Y_0$$

$$\theta = \arctan\frac{X_t}{Y_t} = \arctan\frac{S_1 - S_3 - 2X_0}{S_2 - S_4 - 2Y_0}$$

wherein $\theta$ is the micro-sliding angle.

* * * * *